US007004371B2

(12) United States Patent
Chin

(10) Patent No.: US 7,004,371 B2
(45) Date of Patent: Feb. 28, 2006

(54) GRIPPER AND METHOD FOR DETACHING PACKAGED CHIP FROM PCB

(75) Inventor: Hou-Ging Chin, Taipei Hsien (TW)

(73) Assignee: Primax Electronics Ltd., Taipei (TW)

( * ) Notice: Subject to any disclaimer, the term of this patent is extended or adjusted under 35 U.S.C. 154(b) by 100 days.

(21) Appl. No.: 10/458,266

(22) Filed: Jun. 11, 2003

(65) Prior Publication Data

US 2004/0099709 A1 May 27, 2004

(30) Foreign Application Priority Data

Nov. 25, 2002 (CN) .............................. 02149168 A

(51) Int. Cl.
*B23K 31/00* (2006.01)
*B23K 31/02* (2006.01)
*B23K 1/018* (2006.01)

(52) U.S. Cl. ................ 228/14; 228/119; 228/191; 81/3.4; 81/3.57

(58) Field of Classification Search ................ 228/119, 228/191, 264, 14, 212, 213, 47.1, 48, 49.1, 228/49.2, 49.5; 81/3.4–3.44, 3.55–3.57, 81/384, 488; 901/31–39
See application file for complete search history.

(56) References Cited

U.S. PATENT DOCUMENTS

| | | | | |
|---|---|---|---|---|
| 3,644,980 A | * | 2/1972 | Class et al. .................. 219/201 |
| 4,270,260 A | * | 6/1981 | Krueger ...................... 29/403.4 |
| 4,561,586 A | * | 12/1985 | Abel et al. ................... 228/264 |
| 4,569,473 A | * | 2/1986 | Guiliano ...................... 228/264 |
| 4,632,294 A | * | 12/1986 | Druschel et al. ............ 228/119 |
| 4,828,162 A | * | 5/1989 | Donner et al. ............... 228/6.2 |
| 5,639,011 A | * | 6/1997 | Jacks et al. ............. 228/180.21 |
| 5,715,592 A | * | 2/1998 | Mori et al. .................... 29/762 |
| 6,201,930 B1 | * | 3/2001 | Close et al. ................. 392/379 |
| 6,360,940 B1 | * | 3/2002 | Bolde et al. ................. 228/264 |
| 6,811,072 B1 | * | 11/2004 | Bolde .......................... 228/191 |

* cited by examiner

*Primary Examiner*—Colleen P. Cooke
(74) *Attorney, Agent, or Firm*—Troxell Law Office, PLLC

(57) ABSTRACT

A gripper for detaching a packaged chip from a PCB. The gripper comprises a plurality of hooks, elastic slices, and a heating device. These hooks are used for gripping and hooking the packaged chip. Each hook includes a chip-upholding part and a chip-gripping part, wherein the chip-gripping part is used for gripping the packaged chip, and the chip-upholding part is used for hooking the packaged chip in the gap. These elastic slices are used for providing the elasticity. Each elastic slice comprises a fastened end and a flexible end, wherein the flexible end connects the chip-gripping part and results the hook gripping the packaged chip. The heating device is used for heating the packaged chip to melt the solder balls. Wherein all the bonded fastened ends are exerted an upward force, and the gripper detaches the packaged chip from the PCB when the solder balls of the packaged chip are melted.

8 Claims, 5 Drawing Sheets

GRIPPER AND METHOD FOR DETACHING PACKAGED CHIP FROM PCB

FIELD OF THE INVENTION

This invention relates to a gripper, and to a method for detaching a packaged chip from a PCB (printed circuit board). More particularly, our invention relates to a gripper and a method for detaching a packaged chip from a printed circuit board by a plurality of hooks and a plurality of elastic slices.

BACKGROUND OF THE INVENTION

Following the advance of manufacturing techniques in semiconductor industry, the density level of integrated circuit has been largely upgraded. BGA (Ball-Grid Array) packaged chips have been adopted broadly in many aspects of integrated circuit packaging technique.

This packing method is explained as follows and the illustration is shown in FIG. 1. Referring to FIG. 1 shown as a cross-sectional diagram, a semiconductor die 20 being cut from a wafer is attached with a substrate 10 by an adhesive layer 22. A solder mask 12 overlays the substrate 10 for electrical isolation as well as preventing conductive material from oxidation. A plurality of bounding wires 18 are used to connect the semiconductor die 20 with the conductive traces 14. Afterward, a resin layer 19 is formed upon the substrate 10 through molding process to cover and protect the semiconductor die 20 and the bounding wires 18. On the other hand, a plurality of solder balls 28 are welded on solder pads 30 and then the solder pads 30 are coupled electrically to the via 16. By using the conductive traces 14 as a link the via 16 are connected electrically with the bounding wires 18 so as to complete chip-packing process. Finally attach the solder balls 28 to a plurality of solder pads 36 welded on printed circuit board 34 so as to connect electrically the packaged chip and printed circuit board.

After the packaged chip has been adhered on the PCB, testing is performed to check whether the function of the chip is correct. If the testing results indicate that the chip has errors wherein, we have to carry out the following steps:

Establish a temperature curve for each error packaged chips.

Pick up these error packaged chips.

Rid the residual soldering paste and cleaning the area of error packaged chips that have been picked up.

Replace a new packaged chips for same testing.

Reflow weld these new packaged chips.

Generally, the picking-up procedure is authorized to the specialized companies because they have sophisticated testing equipments and plentiful resources. In addition to outsourcing, purchasing picking-up equipment is another way. However both the two approaches are costly and will burden the company a lot. Hence, in practice some companies pick the chips up using some simple tools, such as pliers, nippers, even their hands. Due to the crudeness of the tools, the solder pads of the printed circuit board are easily torn while picking the chip up. Therefore, it gives us a strong incentive to create an economical apparatus for picking packaged chips up from the PCB.

SUMMARY OF THE INVENTION

The primary object of this invention is to provide a gripper that can reduce the cost for picking up the packaged chips from PCB.

Another object of this invention is to provide a gripper that can apply to packaged chips of any size.

Further object of this invention is to provide a gripper connected to a thermometer, such that the temperature of the solder balls is known for preventing overheating the packaged chip, or pulling the packaged chip too early for the solder balls to melt completely and resulting in the solder pads damaged.

Further object of this invention is to provide a gripper that can display the pulling force by connecting to an outside tension meter, for preventing over-pulling and resulting in the solder pads damaged.

This invention relates a gripper for detaching a packaged chip from a PCB (printed circuit board). The packaged chip comprises a plurality of solder balls in a gap between the packaged chip and the PCB. The gripper comprises a plurality of hooks and a plurality of elastic slices. These hooks are used for gripping and hooking the packaged chip. Each of the plurality of hooks comprises a chip-upholding part and a chip-gripping part, wherein the chip-gripping part is used for gripping the packaged chip, and the chip-upholding part is used for hooking the packaged chip in the gap. The plurality of elastic slices is used for providing the elasticity. Each of the plurality of elastic slices comprises a fastened end and a flexible end, wherein the flexible end connects the chip-gripping part, the flexible end provides the elasticity resulting that the hook gripping the packaged chip, and all of the fastened ends are bonded together. Wherein all the bonded fastened ends are exerted an upward force, and the gripper detaches the packaged chip from the PCB when a heating device provides the heat to the packaged chip for melting the solder balls.

The operation steps of this gripper are explained as follow: First, insert the chip-upholding parts of the hooks into the gap between the packaged chip and the PCB. Second, heat the upside surface of the package chip to melt the solder balls thereof. Then, pick the chip up from the PCB by exerting an upward pulling force to the plurality of bonded fastened ends of the elastic slices.

In the preferred embodiment of this invention, when the chip-upholding part of the hooks grip and hook the packaged chip, each the flexible end of the elastic slices connects the chip-gripping part and be spread. Since the elastic slices are an elastic material, the hooks are forced inward into the center of the gripper. Then the flexible end provides the elasticity resulting the hook gripping the packaged chip. Thus the gripper can fit all packaged chips of different size.

Regarding to the preferred embodiment of this invention, the gripper further comprises a ring posited around said elastic slices. Adjusting the elasticity of the elastic slices by modifying the position of the ring up and down around the elastic slices. Hence, modifying the ring can prevent the packaged chip during the procedure of picking-up from dropping.

If the environmental temperature exceeds the limits of the allowable range of the packaged chip, the chip will be destroyed. Hence, in a preferred embodiment of this invention, a thermometer is added to indicate the temperature of the solder balls before picking-up and the temperature of the packaged chip as well.

While picking-up the packaged chip, if some of the solder balls still firmly adhere to the solder pads of the PCB, the solder pads will be damaged. Hence, in a preferred embodiment of this invention, a force meter is added to indicate the magnitude of the pulling force so as to control the pulling force for preventing over-pulling.

Regarding to the specification aforementioned, this gripper is not only picking up the packaged chip mounted on a PCB in a more economical way, but also fitting all chips of different size. As a result, the need of purchasing tools in accordance with chips of different size can be dropped off. As a result, the need of purchasing tools in accordance with chips of different size can be dropped off. The present invention further comprises a force meter added to indicate the magnitude of the pulling force so as to control the pulling force for preventing over-pulling. In conclusion, it's an ideal device for practical application in the industrial field.

The invention, as well as its many advantages, may be further understood by the following detailed description and drawings. The drawings are only to serve for reference and illustrative purpose, and do not intend to limit the scope of the present invention.

BRIEF DESCRIPTION OF THE APPENDED DRAWINGS

DETAILED DESCRIPTION OF THE INVENTION

The detailed description of the present invention is given by the following heat mode for illustration. The present invention relates a gripper for detaching a packaged chip from a PCB (printed circuit board). This invention can fit all chips of different size. As a result, the need of purchasing tools in accordance with chips of different size can be dropped off. The present invention further comprises a force meter added to indicate the magnitude of the pulling force, so as to control the pulling force for preventing over-pulling.

Figure 2:
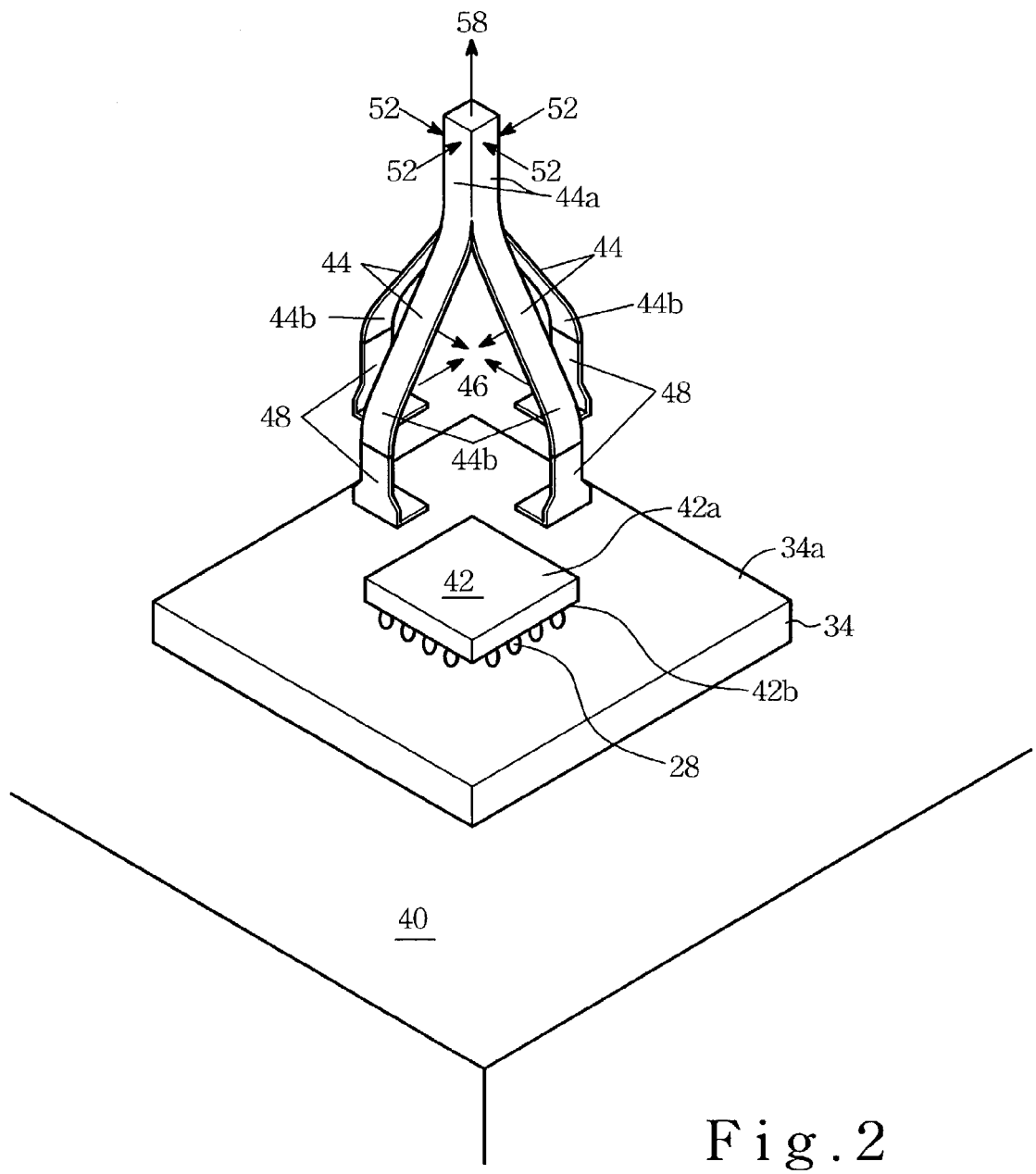
FIG. 2 is a perspective view of a gripper and relative settings of this invention.

As shown in FIG. 2, the gripper 41 comprises four hooks, four elastic slices 44, and a heating device (not shown). A printed circuit board 34 is disposed on a working base 40. A BGA packaged chip 42 which has a plurality of solder balls is mounted on the printed circuit board 34 by using solder balls 28 as the adhesive, and a certain gap is remained between the BGA packaged chip 42 and the PCB 34. Each elastic slice 44 has one fastened end 44a bonded by outside forces 52, and one flexible end 44b connected to the hook 48. As long as the flexible ends of the elastic slices bends outwards, an inwards force 46 will be created to counteract the deformation. Therefore, the inwards force 46 can be applied to grip the packaged chip 42. The heating device is used for providing the heat to the packaged chip for melting the solder balls.

Figure 3:
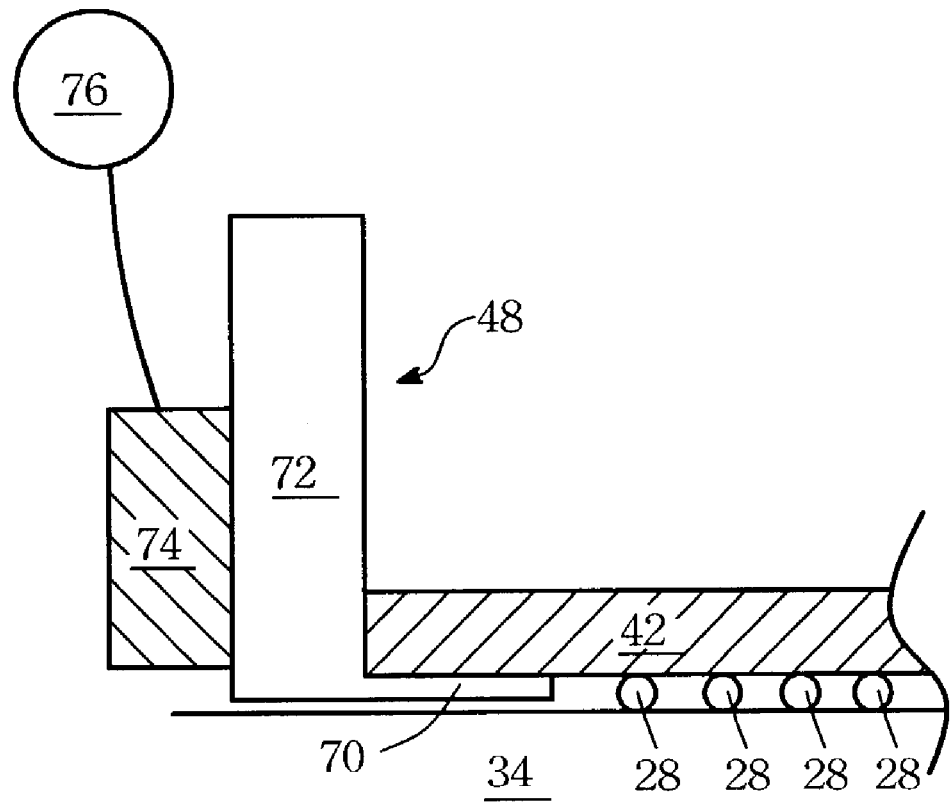
FIG. 3 is a schematic view of a hook with L-shaped cross-section of this invention.

As to the hooks 48 in this embodiment, please referring to FIG. 3, the hook with a L-shaped cross-section consists of one chip-upholding part 70 and one chip-gripping part 72. The hook is made of heat conduction material, e.g., iron, copper . . . etc. The chip-upholding part 70 is inserted to the gap between the downside surface 42b of the packaged chip and the upside surface 34a of the PCB 34. It's noted that the width of this gap is about 0.5 mm, such that the thickness of the chip-upholding part 70 should be smaller than 0.5 mm, so as to insert the chip-upholding part 70.

Figure 4:
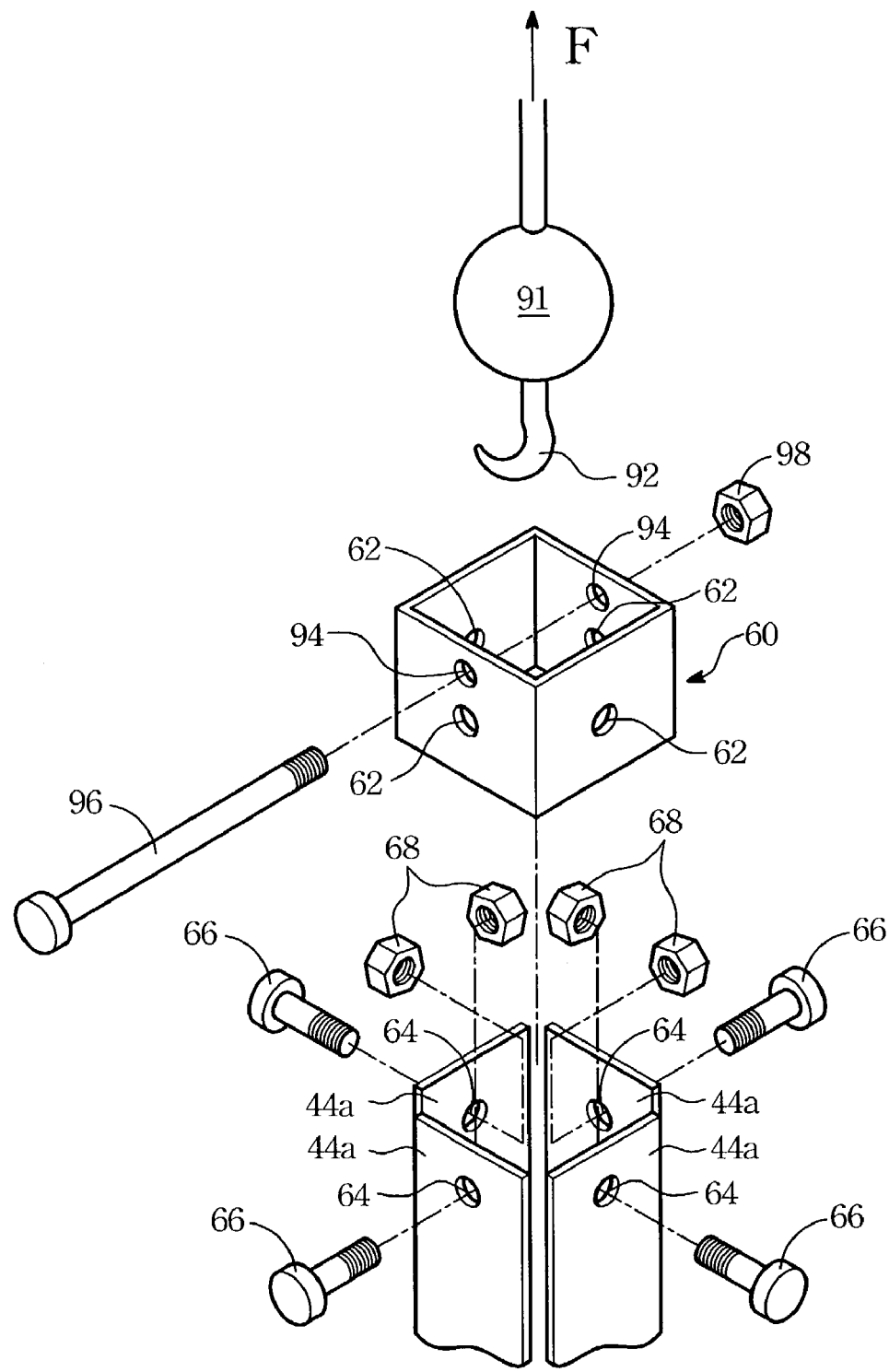
FIG. 4 is an explosive view of a square pipe connected to elastic slices at lower end and a tension meter in upper end of this invention.

In a preferred embodiment, as shown in FIG. 4, a square pipe 60 is employed to fasten the four elastic slices 44 at one end. The square pipe 60 is punched a hole 62 at each side, and the elastic slice is punched a hole 64 at the fastened part 44a of each side. Subsequently fasten the square pipe and the four elastic slices with four nuts 68 and four bolts 66.

The principle of the gripping process is based on the elasticity of the elastic slices. While the hooks grip the packaged chip, the flexible ends of the elastic slices will bend outwards. Since the other end (fastened end) of the elastic slice is fixed, for counteracting the deformation, an inherent force is generated simultaneously forwards to the packaged chip. Hence, the hooks are enforced by four inward force to press the sides of the packaged chip. The advantage of this gripping device is that no other gripping tools are needed for packaged chip of different dimensions. In other words, one gripping tool can fit all size and thus the cost will reduce to the least.

Figure 5:
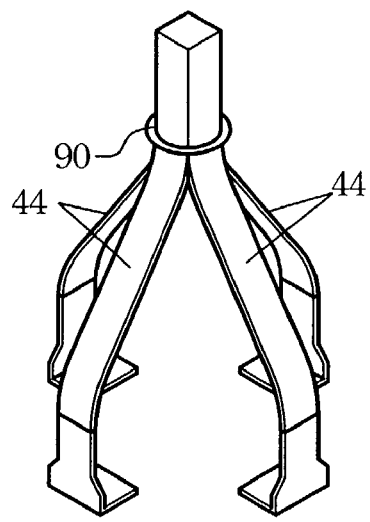
FIG. 5 is a perspective view of a gripping device constrained by a ring of this invention.

In practical application, the elastic slices will not grip the chip firmly, if the elasticity of the elastic slice is too poor, so that the packaged chip could jump out of the hooks easily. In addition, due to the lack of elasticity, some elastic slices could be pulled more seriously than the others, and it causes that some sides of the chip may be detached earlier than the other sides. Hence, if some solder balls haven't melted completely, the over-pulling force could cause the solder pads damaged. In a preferred embodiment, a ring is employed to provide another constraining force. As shown in FIG. 5, a ring 90 is posited around the elastic slices 44 and then the height of the ring 90 is adjusted to tighten or ease the tension of the elastic slices 44. Therefore, before pulling the elastic slices, shift the ring 90 downwards such that the elastic slices are getting tenser and the chip could be gripped more firmly. And it is quite easy to take out the chip after moving the ring upwards.

It is noted that the temperature of the melting point of the solder ball is 210° C. and the highest allowable temperature of the chip is 245° C. Therefore, during the heating process, the temperature of the chip should be kept under 245° C., and the chip should be picked up until the temperature of the solder balls reach 210° C. unless the pad could be torn while pulling the chip due to the incomplete melting of solder balls. For this reason, we connect the hooks to a thermometer for measuring the temperature of solder balls. In this preferred embodiment, a thermo couple is employed as a thermometer, as shown in FIG. 3. The thermo couple consists of a reader 76 and a detector 74 combined with the chip-gripping part 72 of the hook. Because the hook is made of material with good heat conductibility, during the heating process, the heat received by the chip 42 will be conducted to the solder balls 28 as well as the hooks 48 simultaneously. Therefore, once the system reaches heat balance, the temperature of the detector 74 connected with the hook will be close to that of solder balls 28. Consequently, as long as the temperature indicated by the reader 76 falls in safe range, it will be no problem to pick the chip up.

Furthermore, a force meter is adopted to protect the packaged chip. For example, during the heating process, if the thermometer indicates the temperature has reached the melting point, and the packaged chip is allowed picked up. However, in some situations the other sides of the packaged chip haven't reach the melting temperature, thus the solder balls at these sides are still attached firmly to the solder pads of the printed circuit board. This could result in solder pads torn. Therefore, in a preferred embodiment, a tension meter is connected externally to the gripping device for measuring the pulling force F. As shown in FIG. 4, the square pipe 60 used to fasten the elastic slices is drilled two holes 94 on the opposite sides. Then a bolt 96 and a nut 98 are united through the holes 94 and are caught by the hook end 92 of the tension meter 91. According to the indication of the tension meter 91 we can control the force F for protecting the solder pads from being torn.

Figure 6:
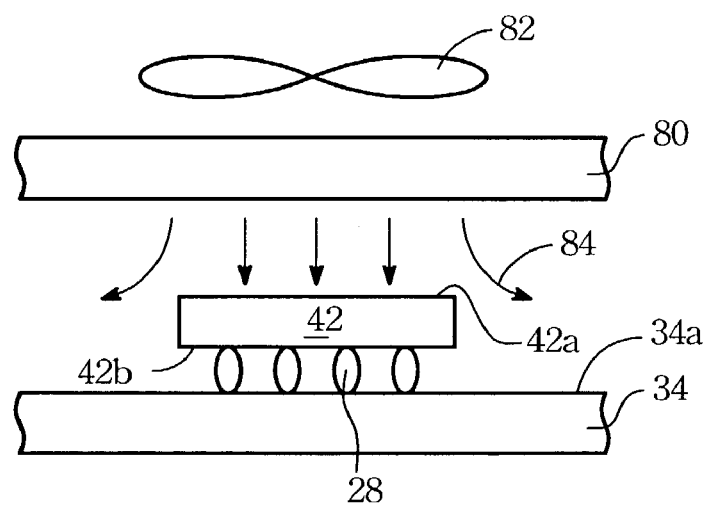
FIG. 6 is a schematic view of a heating means of this invention.

The heating device in this preferred embodiment consists of one heater 80 and one fan 82, as shown in FIG. 6. The air driven by the fan 82 is heated by the heater 80. Afterward, a hot steady airflow 84 is blown over the upper surface 42a of the packaged chip 42. By this way, the thermo energy received by the packaged chip 42 is transferred to solder balls 28 by conduction. As long as the solder balls 28 melt completely, it is permitted to pick up the packaged chip.

Alternatively, the packaged chip can also be heated by an infrared radiator. For example, an infrared radiator is disposed above the packaged chip and then radiates the surface of heat the packaged chip. For the same reason as foregoing embodiment, the solder balls can be heated by conduction.

The operation steps are explained as follows. Referring to FIG. 2, at first the four hooks 48 are inserted to the gap between the packaged chip 42 and the printed circuit board 34. The inward forces 46 due to the deformation of elastic slices will push the four hooks 48 to compress the four sides of the packaged chip 42. Afterward, the upper surface 42a of the packaged chip is heated by a heating device (not shown). The thermal energy is transferred to the solder balls 28 by way of conduction so as to heat up the solder balls 28 indirectly. As the solder balls 28 melted completely, the gripper 41 is pulled upwards to detach the packaged chip 42 from the printed circuit board 34.

In summary, comparing with conventional techniques, this invention has the following advantages:

a. The gripping device of this invention has a simpler structure and can apply to any packaged chip of different dimensions.

b. By connecting to an outer thermometer, the gripping device can prevent the solder pads torn or chip damaged resulted from the hard solder balls or intolerable temperature.

c. By connecting to an outer tension meter, the gripping device can prevent the solder pads torn resulted from picking up the packaged chip too seriously.

While the preferred embodiments of the invention have been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

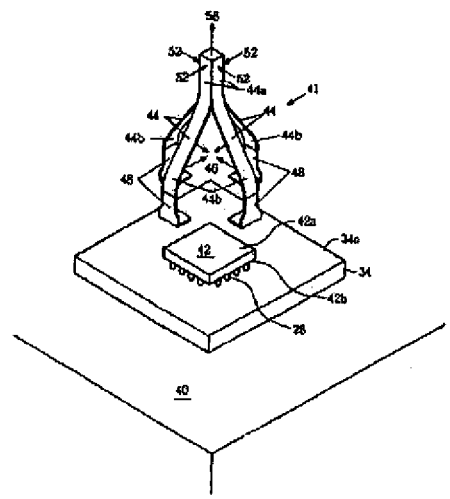

What is claimed is:

1. A gripper for detaching a packaged chip from a printed circuit board, the packaged chip including a plurality of solder balls located in a gap between the printed circuit board and the packaged chip, the gripper comprising:
   a) four elastic slices, each of the four elastic slices being an elastic member and having:
      i) a fastened end; and
      ii) a flexible end;
   b) four hooks selectively engaging four sides of a packaged chip, each of the four hooks is fixedly connected to the flexible end of one of the four elastic slices, each of the four hooks having:
      i) an upholding part inserted into the gap between the printed circuit board and the packaged chip; and
      ii) a chip-gripping part connected to the flexible end of one of the four slices and selectively engaging a side of the packaged chip; and
   wherein each of the four elastic slices is fixedly connected together at the fastened end thereof forming a connected end having a square cross section, wherein the connected end includes a square pipe having four side surfaces, the fastened end of each of the four elastic slices is fixedly connected to one of the four side surfaces of the square pipe.

2. The gripper according to claim 1, further comprising a ring located round the four elastic slices and adjusting an elasticity of the four elastic slices.

3. The gripper according to claim 1, wherein each of the four hooks is an L-shaped hook.

4. The gripper according to claim 1, wherein each of the four hooks includes a thermometer measuring the temperature of the plurality of solder balls.

5. The gripper according to claim 4, wherein the thermometer is a thermocouple.

6. The gripper according to claim 1, further comprising a tension meter connected to the four elastic slices and measuring a detaching force applied to the packaged chip.

7. The gripper according to claim 1, further comprising a heating device having a heater and a fan, the heater providing heat, and the fan blowing the heat on the plurality of solder balls.

8. The gripper according to claim 7, wherein the heating device is an infrared radiator.

* * * * *

UNITED STATES PATENT AND TRADEMARK OFFICE
CERTIFICATE OF CORRECTION

| | |
|---|---|
| PATENT NO. | : 7,004,371 B2 |
| APPLICATION NO. | : 10/458266 |
| DATED | : February 28, 2006 |
| INVENTOR(S) | : Hou-Ging Chin |

It is certified that error appears in the above-identified patent and that said Letters Patent is hereby corrected as shown below:

The title page showing the illustrative figure should be deleted to be replaced with the attached title page.

UNITED STATES PATENT AND TRADEMARK OFFICE
CERTIFICATE OF CORRECTION

Figure 1:
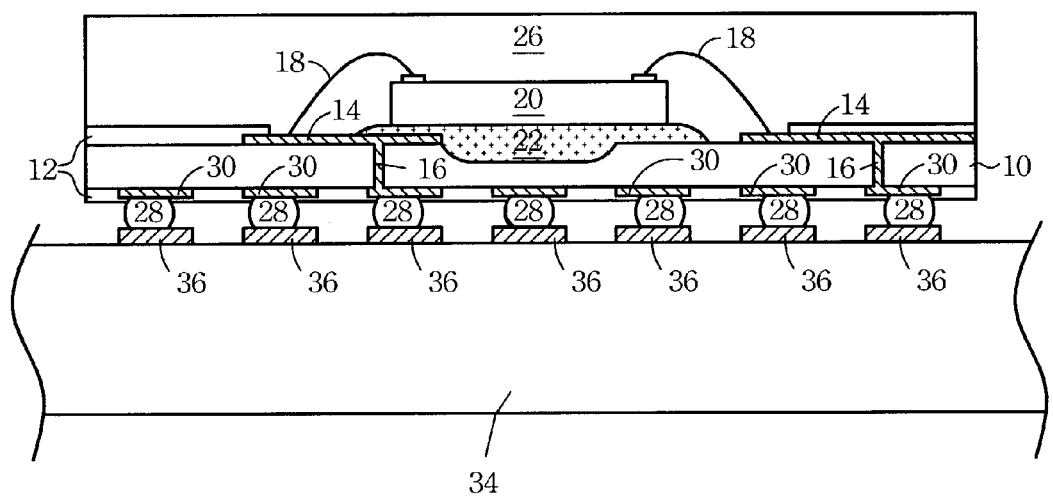
FIG. 1 is a schematic view of a ball grid array packaged chip mounted on a printed circuit board by adapting the conventional technique.

PATENT NO.        : 7,004,371 B2
APPLICATION NO.   : 10/458266
DATED             : February 28, 2006
INVENTOR(S)       : Hou-Ging Chin It is certified that error appears in the above-identified patent and that said Letters Patent is hereby corrected as shown below:

Drawings
Sheet 1, replace Fig. 1 with the figure depicted herein below, wherein the reference "19" indicating the "Resin Layer" has been added.

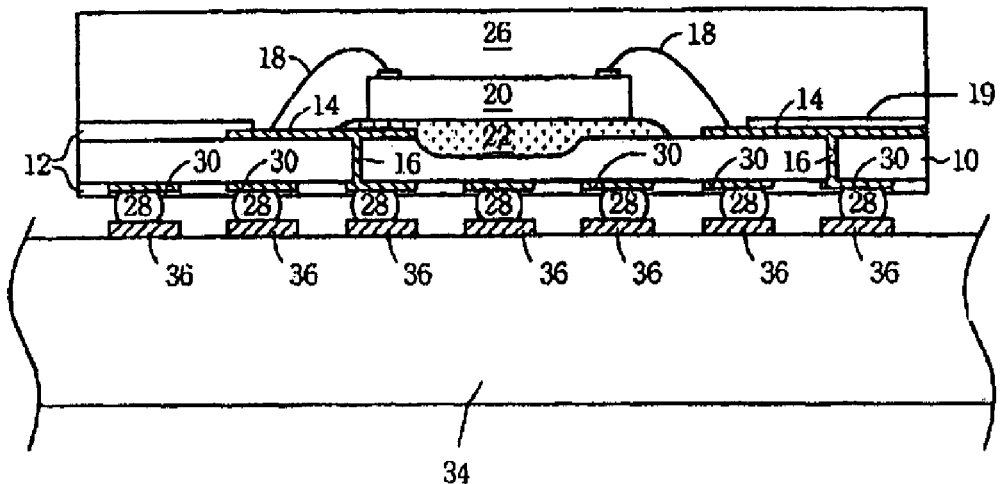

Fig.1 (Prior Art)

UNITED STATES PATENT AND TRADEMARK OFFICE
CERTIFICATE OF CORRECTION

PATENT NO.        : 7,004,371 B2                                Page 3 of 5
APPLICATION NO. : 10/458266
DATED              : February 28, 2006
INVENTOR(S)       : Hou-Ging Chin It is certified that error appears in the above-identified patent and that said Letters Patent is hereby corrected as shown below:

Drawings
Sheet 2, replace Fig. 2 with the figure depicted herein below, wherein the reference "41" has been added.

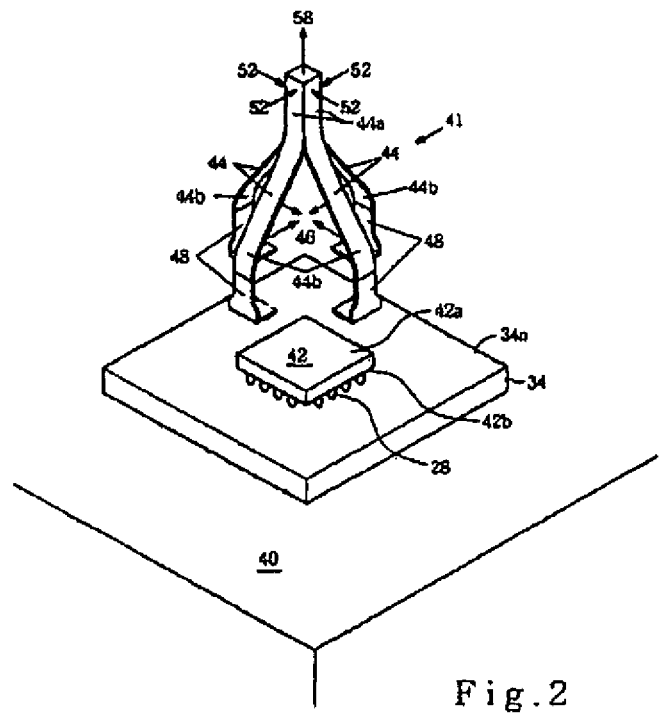

Fig.2

UNITED STATES PATENT AND TRADEMARK OFFICE
CERTIFICATE OF CORRECTION

PATENT NO. : 7,004,371 B2
APPLICATION NO. : 10/458266
DATED : February 28, 2006
INVENTOR(S) : Hou-Ging Chin It is certified that error appears in the above-identified patent and that said Letters Patent is hereby corrected as shown below:

Column 1
Lines 16-17, change "circuit" to --circuits--.
Line 54, after "However", insert --,--.

Column 2
Line 34, change "follow" to --follows--.
Line 49, after "Regarding", remove |to|.

Column 3
Line 1, after "Regarding", remove |to|.
Line 63, remove |please|.

Column 5
Line 16, change "By" to --In--.
Line 34, change "melted" to --melt--.

Signed and Sealed this

Seventh Day of April, 2009

JOHN DOLL
*Acting Director of the United States Patent and Trademark Office*

United States Patent
Chin

(10) Patent No.: US 7,004,371 B2
(45) Date of Patent: Feb. 28, 2006

(54) GRIPPER AND METHOD FOR DETACHING PACKAGED CHIP FROM PCB

(75) Inventor: Hau-Ging Chin, Taipei Hsien (TW)

(73) Assignee: Primax Electronics Ltd., Taipei (TW)

( * ) Notice: Subject to any disclaimer, the term of this patent is extended or adjusted under 35 U.S.C. 154(b) by 100 days.

(21) Appl. No.: 10/458,266

(22) Filed: Jun. 11, 2003

(65) Prior Publication Data

US 2004/0099709 A1 May 27, 2004

(30) Foreign Application Priority Data

Nov. 25, 2002 (CN) ............................ 02149168 A

(51) Int. Cl.
*B23K 31/00* (2006.01)
*B23K 31/02* (2006.01)
*B23K 1/018* (2006.01)

(52) U.S. Cl. .................. 228/14; 228/119; 228/191; 81/3.4; 81/3.57

(58) Field of Classification Search ............. 228/119, 228/191, 264, 14, 212, 213, 47.1, 48, 49.1, 228/49.2, 49.5; 81/3.4–3.44, 3.55–3.57, 81/384, 488; 901/31–39
See application file for complete search history.

(56) References Cited

U.S. PATENT DOCUMENTS

| | | | |
|---|---|---|---|
| 3,644,980 A * | 2/1972 | Class et al. ............... 219/201 |
| 4,270,260 A * | 6/1981 | Krieger ..................... 29/403.4 |
| 4,561,586 A * | 12/1985 | Abel et al. ................. 228/264 |
| 4,569,473 A * | 2/1986 | Guiliano .................... 228/264 |
| 4,632,294 A * | 12/1986 | Druschel et al. ........... 228/119 |
| 4,828,162 A * | 5/1989 | Donner et al. .............. 228/6.2 |
| 5,639,011 A * | 6/1997 | Jacks et al. ............. 228/180.21 |
| 5,715,592 A * | 2/1998 | Mori et al. .................... 29/762 |
| 6,201,930 B1 * | 3/2001 | Close et al. ............... 392/379 |
| 6,360,940 B1 * | 3/2002 | Bolde et al. ............... 228/264 |
| 6,811,072 B1 * | 11/2004 | Bolde ....................... 228/191 |

* cited by examiner

*Primary Examiner*—Colleen P. Cooke
(74) *Attorney, Agent, or Firm*—Troxell Law Office, PLLC

(57) ABSTRACT

A gripper for detaching a packaged chip from a PCB. The gripper comprises a plurality of hooks, elastic slices, and a heating device. These hooks are used for gripping and hooking the packaged chip. Each hook includes a chip-upholding part and a chip-gripping part, wherein the chip-gripping part is used for gripping the packaged chip, and the chip-upholding part is used for hooking the packaged chip in the gap. These elastic slices are used for providing the elasticity. Each elastic slice comprises a fastened end and a flexible end, wherein the flexible end connects the chip-gripping part and results the hook gripping the packaged chip. The heating device is used for heating the packaged chip to melt the solder balls. Wherein all the bonded fastened ends are exerted an upward force, and the gripper detaches the packaged chip from the PCB when the solder balls of the packaged chip are melted.

8 Claims, 5 Drawing Sheets